(12) United States Patent
Huang et al.

(10) Patent No.: US 6,468,354 B2
(45) Date of Patent: Oct. 22, 2002

(54) SEMICONDUCTOR WAFER SUPPORT

(75) Inventors: Cheng-Yi Huang, Hsin Chu; Tsung-Chieh Tsai, Tainan; Kuo-Hung Liao, Hsin-Chu, all of (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 09/910,593

(22) Filed: Jul. 20, 2001

(65) Prior Publication Data
US 2002/0026900 A1 Mar. 7, 2002

Related U.S. Application Data

(63) Continuation-in-part of application No. 09/412,132, filed on Oct. 5, 1999, now abandoned.

(51) Int. Cl.[7] .................................................. C23C 16/00
(52) U.S. Cl. ........................................ 118/730; 118/728
(58) Field of Search .................................. 118/725, 728, 118/729, 730

(56) References Cited

U.S. PATENT DOCUMENTS

| 5,830,277 | A | * | 11/1998 | Johnsgard | 118/730 |
| 6,048,403 | A | * | 4/2000 | Deaton | 118/725 |
| 6,069,095 | A | * | 5/2000 | Haider | 438/795 |

* cited by examiner

Primary Examiner—Richard Bueker
(74) Attorney, Agent, or Firm—Tung & Associates

(57) ABSTRACT

A wafer support for supporting and rotating a semiconductor wafer within a rapid thermal process chamber is formed of a single member of unitary construction. The unitary member includes a first, horizontal section for supporting the periphery of the wafer thereon, and a downwardly extending cylindrical section that is mounted for rotation within the chamber. The first and second sections are integrally formed to prevent radiant energy from passing there between and comprise materials that cause the support to act as a black body, yielding more uniform heating of the wafer. A recess formed in the horizontal section receives the outer edge of the wafer and prevents radiant heat from passing between the wafer and the support in those cases where the wafer is warped.

9 Claims, 1 Drawing Sheet

SEMICONDUCTOR WAFER SUPPORT

RELATED APPLICATIONS

This is a continuation-in-part (CIP) application of U.S. patent application Ser. No. 09/412,132, filed Oct. 5, 1999 now abandoned.

TECHNICAL FIELD

The present invention broadly relates to devices for holding or supporting semiconductor wafers during fabrication processes, and deals more particularly with a device for supporting a wafer in a rapid thermal processing system.

BACKGROUND OF THE INVENTION

Various types of devices have been developed in the past to support individual semiconductor wafers within a chamber used to process the wafer as part of a manufacturing operation. Such chambers are used to conduct various types of processing operations under a controlled environment, including chemical vapor deposition (CVD) and physical vapor deposition (PVD). In order to control the temperature within the processing chamber, various types of heating systems can be integrated into the semiconductor processing station, of which the chamber forms a part. One type of heating system used in processing stations is referred to as a rapid thermal processing (RTP) system which is employed to conduct rapid thermal oxidation and rapid thermal annealing of a wafer within the processing chamber. RTP systems have several advantages over conventional furnace systems. For example, one limitation of a furnace system employed to carry out oxidation processes is its inertia to temperature transition, resulting in a higher thermal budget. The thermal budget can be reduced considerably by reducing the duration of these transitions through the use of RTP. In the case of annealing processes wherein annealing removes defects introduced by an ion implantation, the use of RTP systems provides a higher level of dopant activation and annealing effect, compared to conventional furnace systems.

In an RTP system, a semiconductor wafer is rapidly heated from a low temperature to a high processing temperature. It is held at this elevated temperature for a short time and then brought back rapidly to a low temperature. RTP durations at high processing temperatures vary from 1 to 5 minutes. During the RTP process, the wafer is held on a support which in turn rotates the wafer in order to achieve uniform wafer heating. The heat source typically comprises a multiplicity of radiant heating elements, typically thermal generating lamps spatially arranged into a plurality of heating zones. In one construction, the heating elements are arranged to face one side of the wafer, while a plurality of sensing devices, such as infrared pyrometers or emissometers are arranged on the opposite side of the wafer to sense the temperature of the wafer backside.

Precise temperature control in RTP systems over the entire processing cycle is often critical to achieving acceptable processing results. This means that the temperature at each monitored location in the chamber must be maintained within certain limits during the temperature ramp-up and ramp-down sequences. When the temperature at one or more monitored locations is not maintained within desired limits, a fault occurs which may have a material adverse effect on the quality of the process, and thus on the quality of the processed wafer.

The task of accurately monitoring the temperature at multiple locations in the processing chamber is complicated by several factors. One factor affecting monitoring accuracy is related to the presence of foreign particles or residue within the chamber. Such foreign materials and residue are often generated in the processing of previous wafers or in residue or small broken fragments of wafers remaining in the chamber. Such residue and wafer fragments within the chamber alter the emissivity measurements taken by the temperature sensors, thus giving rise to inaccurate readings that may prevent the detection of temperature control faults. Inaccurate temperature readings can also result from the temperature sensors receiving radiant heat emanating from a source other than the wafer being monitored.

The construction of prior art wafer supports has contributed to both types of temperature measurement errors discussed above. Prior art wart wafer supports used in RTP systems were of a 2 piece construction, comprising a flat annular ring for supporting the peripheral edge of the wafer, and a downwardly extending cylindrical member supporting the ring and mounted for rotation within the processing chamber so as to rotate the wafer during the RTP process. It was not practical to achieve a complete seal between the 2 pieces on the wafer support, consequently a small space or gap was present between the 2 pieces. As a result, residue or small foreign particles present at the top of the chamber were allowed to pass through the gap in the wafer support, thus migrating into the lower part of the chamber, beneath the wafer, and settling on the temperature sensors thereby affecting temperature measurements. Additionally, radiant heat from the radiant heat source above the wafer was allowed to pass through the gap between the wafer support components or between the support and the wafer itself, thus passing into the lower half of the chamber. As a result, the temperature sensors received some amount of heat directly form the radiant heat source such that the heat sensed by these sensors did not originate entirely from the back side of the wafer which they were intended to monitor. Consequently, this direct reading of radiant heat emanating from the heat source resulted in inaccurate measurement of wafer temperature.

In addition to the deficiencies of prior art wafer supports mentioned above, the non-uniform surface and/homogeneity of the materials used to form the wafer support also contributed to temperature measurement error since non-uniform heating of the support prevented the wafer from achieving the desired temperature profile.

From the foregoing, it is apparent that there is a clear need in the art for an improved wafer support which eliminates the deficiencies of the prior art construction discussed above. The present invention is directed toward overcoming these deficiencies.

SUMMARY OF THE INVENTION

In accordance with the present invention, a semiconductor wafer support is provided for use in a thermally controlled process chamber provided with a radiant heat source and a radiant heat temperature sensor for sensing the temperature of the wafer. The support comprises a one piece member of unitary construction, having a horizontal section and a downwardly extending cylindrical section seamlessly interconnected by an elbow section. The horizontal section includes a radially inwardly extending annular surface forming a lip for supporting the periphery of the wafer thereon. In the preferred embodiment, the lip is formed in the horizontal section so as to define a recess to assist in registering and retaining the wafer in a desired position, while reducing the possibility of thermal radiation leakage between the wafer and the support. The horizontal section is mounted, as with magnetic means, for rotation within the chamber so as to rotate the wafer during the RTP process.

The wafer support if preferably formed of silicon carbide and is coated with a layer of silicon so as to be uniformly and highly absorbent of radiant heat.

BRIEF DESCRIPTION OF THE DRAWINGS

In the drawings, which form an integral part of the specification and are to be read in conjunction therewith, and in which like reference numerals are employed to designate identical components in the various views.

DETAILED DESCRIPTION OF THE PREFERRED EMBODIMENT

Figure 1:
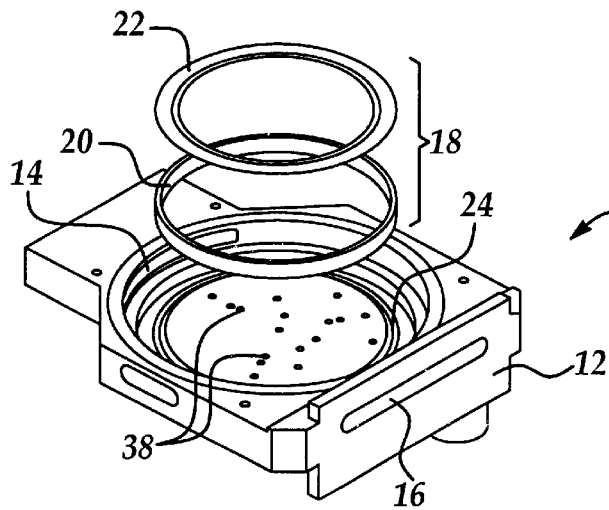
FIG. 1 is an exploded perspective view of the lower portion of an RTP processing chamber depicting a wafer support according to the prior art.
Figure 2:
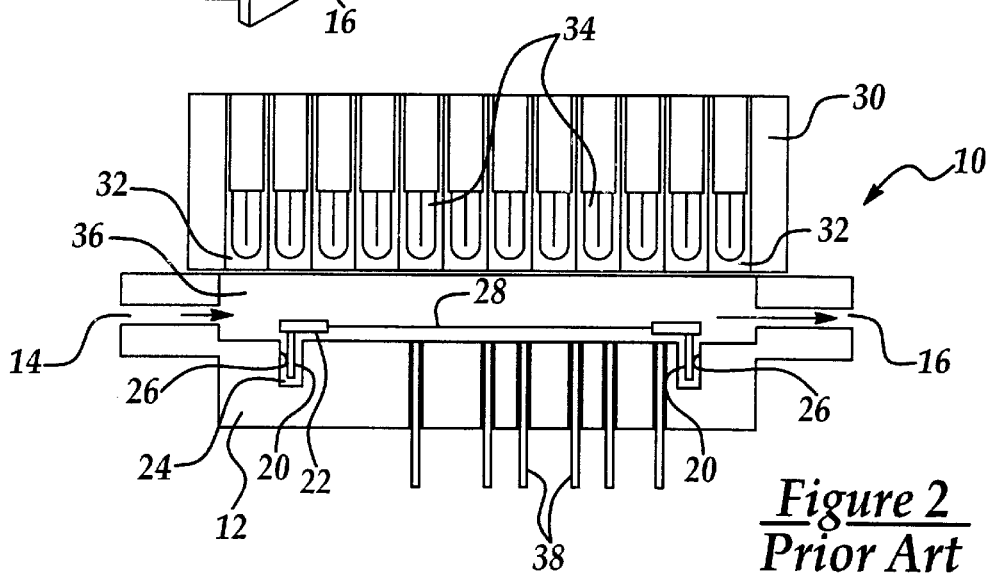
FIG. 2 is a cross-sectional view of an RTP processing chamber also depicting a prior art wafer support having a wafer placed thereon.

Referring first to FIGS. 1 and 2, the present invention generally relates to a support for holding and supporting a typical semiconductor wafer 28 within a semiconductor wafer processing chamber forming part of a processing station at which any of a number of processing operations may be performed including PVD, CVD, thermal oxidation and thermal annealing. In the illustrated embodiment, the processing station includes an RTP chamber assembly, generally indicated by the numeral 10, which includes an upper portion 30 and a lower portion 12 that are releasable clamped together by any suitable means (not shown). The RTP chamber 10 includes an internal processing chamber 36 which is coupled with an inlet 14 and an outlet 16 which permits the introduction of a processing gas into the chamber 36. The upper portion 30 includes a multiplicity of radiant heating elements in the form of thermal generating lamps 34, spatially arranged into a plurality of heating zones so as to produce a desired, 2 dimensional thermal profile onto the face of a semiconductor wafer 18 held on a wafer support 18, constructed in accordance with a prior art. The lamps 34 are respectively disposed within a multiplicity of light types 32 which assist in guiding the radiant heat generated by the lamps 34, downwardly to impinge on the surface of the wafer 28.

The lower portion 12 of the RTP chamber assembly 10 includes an annular recess 24 within there is disposed a magnetic bearing assembly (not shown), thus journaling the wafer support 18 for rotation. Lateral guides 26 are provided within the recess 24 which engage and help maintain the wafer support in proper registration. The wafer support 18 includes an upper, ring shaped member 22 formed of silicon carbide. The upper ring 22 sits on the upper end of a cylindrical ring 20 formed of quartz. The upper ring 22 supports the outer periphery of the wafer 28 and fits on top of, but is not secured to, the lower ring 26 which extends downwardly into the recess 24 and is adapted to engage the guides 26.

A plurality of temperature sensors, preferably in the form of pyrometers, include corresponding optical fibers 38 which extend through the lower portion 12 of the chamber assembly 10 and are oriented to sense the temperature at various preselected locations on the back side of the wafer 28.

Several problems arise in connection with the 2 piece construction of the wafer support 18. First, because the upper ring 22 narrowly sits upon the lower ring 20, rotation of the support 18 where the wafer is supported on the upper ring 22 can result in relative rotation of the upper ring 22 relative to the lower ring 20. This relative rotation can cause a rubbing action between the rings 22, that produce small particles and filings which drop down onto the ends of the optical fibers 38, thereby affecting temperature readings.

A second problem resulting from the 2 piece construction of the wafer support 18 involves the leakage of thermal radiation from the lamps 34 to the optical fibers 38. This leakage occurs in either of 2 ways. First, radiant energy may pass between the upper surface of the upper ring 22 and the periphery of the wafer 28, particularly when the wafer is slightly warped. Second, leakage of thermal radiation may occur between the interface between the rings 20 an 22 where a gap may be present there between.

Figure 3:
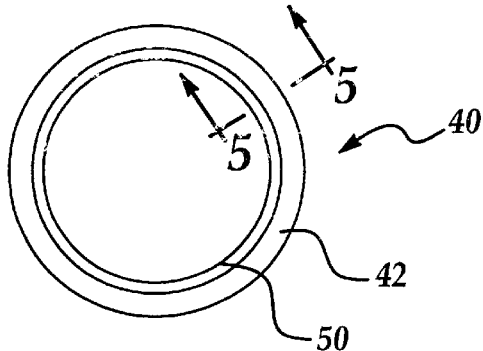
FIG. 3 is a plan view of a wafer support that forms the preferred embodiment of the present invention.
Figure 4:
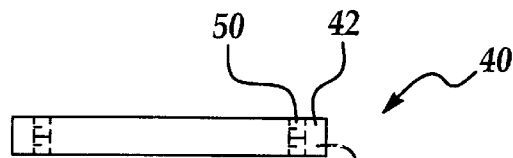
FIG. 4 is a side view of the wafer support shown in FIG. 3.
Figure 5:
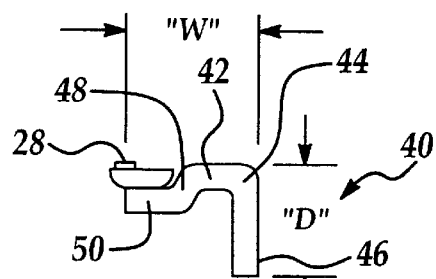
FIG. 5 is a sectional view taken along the line 5—5 in FIG. 3, but showing an edge of a wafer mounted on the support.

Referring now also to FIGS. 3–5, an improved wafer support is provided, which is generally indicated by the numeral 40. The wafer support 40 comprises an upper, generally horizontal section 42 having a width dimension "W". Horizontal section 42 includes a ring shaped surface extending radially inward, and is connected by an elbow section 44 to a generally cylindrical vertical section 46 having a depth dimension "D". The vertical section 46 includes a ring shaped surface that extends downwardly from the elbow section 46. The values of the dimensions "W" and "D" should be within ±20% of each other. For example, in a suitable embodiment, "W" may be 26.5 mm, and "D" may be 25.0 mm. Dimensional values for "W" and "D" that are within the above mentioned ±20% have been found to result in an exceptionally stable, rigid, yet lightweight wafer support when employing the unique unitary construction disclosed herein. The upper, horizontal section 42 includes a downwardly stepped lip 50 connected by a second elbow section 48 to the upper, main portion of upper section 42. The lip 50 forms a recess and supports the outer periphery of the wafer 28. The provision of the recessed lip 50 helps assure that radiant energy will not pass between the interface between lip 50 and wafer 28, even when the latter is slightly warped.

Wafer support 40 is of a one piece, unitary construction formed preferably of silicon carbide and is preferably coated with a layer of thermally absorbing material such as silicon so that the support is comprised of a homogenous material and acts as a black body that is subject to uniform heating, without any hot spots that tend to be transferred to the wafer 28. Moreover, because the improved support 40 is of unitary construction it possess upper and lower rings 20 and 22, which are integrally connected by the elbow 44, the possibility that thermal radiation passing between gaps within the ring 40 which are picked up by optical fibers 38 is completely eliminated.

From the foregoing, it is apparent that the improved wafer support described above not only provides for the reliable accomplishment of the objects of the invention but does so in a peculiarly efficient and economical manner. It is recognized, of course, that those skilled in the art may make various modifications or additions to the preferred embodiment chosen to illustrate the invention without departing from the spirit and scope of the present contribution to the art. Accordingly, it is to be understood that the protection sought and to be afforded hereby should be deemed to extend to the subject matter claimed and all equivalents thereof fairly within the scope of the invention.

What is claimed is:

1. For use in a rapid thermal process chamber for processing semiconductor wafers, and of the type employing a radiant heat source on one side of said wafer for heating said wafer and sensor means on the opposite side of said wafer for sensing the temperature of said wafer, a rotatable wafer support, comprising:

a unitary member having
      an upper, generally horizontal ring shaped section having a width "W", and including a surface extending radially inward for supporting the outer periphery of said wafer thereon, and
      a lower, generally vertical ring shaped section having a depth "D", and including a surface extending downwardly from and formed integrally with said upper section, the values of said width "W" and said depth "D" being within ±20% of each other,
   said upper and lower sections being formed of a single, homogeneous piece of silicon carbide having a continuous coating of silicon thereover to cause said member to act as a radiation black body.

2. The wafer support of claim 1, wherein said unitary member includes an elbow section integrally formed with and connecting said upper and lower section surfaces throughout the circumference of said surfaces.

3. The wafer support of claim 2, wherein said surface extending radially inward is spaced below an upper region of said elbow to form a recess in said unitary member, said wafer being received within said recess.

4. A semiconductor wafer support for use in a thermally controlled process chamber provided with a radiant heat source on one side of said wafer, and radiant heat temperature sensor means on the other side of said wafer for sensing the temperature of said wafer, said wafer support comprising:

a one-piece member of unitary construction,
   said member including a generally cylindrical section having a first dimension "D" extending vertically and a generally horizontal section having a second dimension "W" on the upper end of said cylindrical section, said horizontal section including a lip extending radially inward from said cylindrical section and configured to support the horizontal periphery of said wafer thereon, the values of said first dimension and said second dimension being within ±20% of each other,
   said cylindrical section and said horizontal section being formed of a single, homogeneous piece of silicon carbide having a continuous coating of silicon thereover to cause said member to act as a radiation black body.

5. The wafer support of claim 4, wherein said lip includes a circumferentially extending recess therein and an upper surface supporting said wafer around the entire circumference of said wafer.

6. The wafer support of claim 4, wherein said cylindrical section and said horizontal section are connected by and formed integral with an elbow section, said elbow section extending around the entire circumference of said member and preventing radiant heat from said source from passing between said cylindrical section and said horizontal section.

7. The wafer support for supporting a semiconductor wafer within a processing chamber and applying a radiant heat source for heating said wafer, comprising:

a horizontal first section for supporting said wafer thereon, and having a width dimension "W"; and
   a generally cylindrical second section extending downwardly from said first section and adapted to be mounted for rotation so as to rotate said wafer, said second section having a depth dimension "D",
   said first and second sections being joined together around their entire peripheries so as to prevent radiant heat from passing therebetween, the values of said width dimension "W" and said depth dimension "D" being within ±20% of each other,
   said first and second sections being formed of a single, homogeneous piece of silicon carbide having a continuous coating of silicon thereover to cause said support to act as a radiation black body.

8. The wafer support of claim 7, wherein said first and second sections are formed integral with each other.

9. The wafer support of claim 7, wherein said first section includes a recess therein for receiving and retaining the outer periphery of said wafer.

* * * * *